(12) United States Patent
Chang et al.

(10) Patent No.: US 11,131,894 B2
(45) Date of Patent: Sep. 28, 2021

(54) DISPLAY DEVICE

(71) Applicant: Au Optronics Corporation, Hsinchu (TW)

(72) Inventors: Chin-Hao Chang, Hsinchu (TW); Wei-Li Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/916,041

(22) Filed: Jun. 29, 2020

(65) Prior Publication Data

US 2021/0173272 A1 Jun. 10, 2021

(30) Foreign Application Priority Data

Dec. 4, 2019 (TW) ................................. 108144203

(51) Int. Cl.
*G06F 3/038* (2013.01)
*G02F 1/1362* (2006.01)
*G02F 1/1345* (2006.01)
*H01L 27/32* (2006.01)

(52) U.S. Cl.
CPC .... *G02F 1/136286* (2013.01); *G02F 1/13452* (2013.01); *G02F 1/13454* (2013.01); *H01L 27/3276* (2013.01)

(58) Field of Classification Search
CPC ... G02F 1/1345; H01L 27/124; H05K 1/0265; H05K 1/167; H05K 2201/0784; H05K 2201/09263
See application file for complete search history.

(56) References Cited

U.S. PATENT DOCUMENTS

| 9,507,229 | B2 | 11/2016 | Chen et al. |
| 2015/0332644 | A1* | 11/2015 | Fujikawa ............ G02F 1/13452 345/100 |
| 2016/0026047 | A1* | 1/2016 | Chen ................... G02F 1/13452 257/88 |

FOREIGN PATENT DOCUMENTS

| CN | 104062789 | 9/2014 |
| CN | 104076544 | 10/2014 |
| CN | 105242466 | 1/2016 |

* cited by examiner

*Primary Examiner* — Insa Sadio
(74) *Attorney, Agent, or Firm* — JCIPRNET

(57) ABSTRACT

A display device is provided. The display device includes an internal driving circuit, an external circuit and a plurality of signal lines. The signal lines are electrically connected with the internal driving circuit and the external circuit. Each signal line includes N signal line sections, Ma first turning points and Mb second turning points, wherein the N signal line sections are connected with each other, each of the Ma first turning points and the Mb second turning points is located at the connecting site of the two adjacent signal line sections, N and Ma are positive integers, Mb is 0 or a positive integer, N≥3, Ma≥2, Ma+Mb≤N−1, the resistance change rate between the two adjacent signal line sections connected with each first turning point is ΔR, and 0<|ΔR|≤10%.

10 Claims, 6 Drawing Sheets

DISPLAY DEVICE

CROSS-REFERENCE TO RELATED APPLICATION

This application claims the priority benefit of Taiwan application serial no. 108144203, filed on Dec. 4, 2019. The entirety of the above-mentioned patent application is hereby incorporated by reference herein and made a part of this specification.

BACKGROUND

Technical Field

The present invention relates to a display device, and more particularly, to a display device with an internal driving circuit.

Description of Related Art

In order to realize a slim border display panel, gate driver-on-array (GOA) technology has been developed, which is a technology that an external driving chip is replaced by arranging a gate driving circuit structure in the peripheral area of the display panel. As the requirements of the display panel for resolution continue to increase, in order to meet the requirements of the slim border design, the signal line density of the display panel using GOA technology in the peripheral area is bound to increase. As a result, the temperature rising degree of the signal lines caused by the impedance mismatch of the signal line is likely to increase due to the increased signal line density, thereby causing safety problems.

SUMMARY

The present invention provides a display device, which can effectively suppress the temperature rising degree of the signal line in the peripheral area with high resolution and slim border.

A display device provided by an embodiment of the present invention has a display area and a peripheral area. The peripheral area is located at at least one side of the display area and includes an internal drive circuit area and a wiring area. The display device includes a pixel array, an internal driving circuit, and a plurality of signal lines. The pixel array is disposed in the display area. The internal driving circuit is disposed in the internal driving circuit area, and is electrically connected with the pixel array. The plurality of signal lines are disposed in the wiring area, and are electrically connected with the internal driving circuit and an external circuit, wherein each of these signal lines includes N signal line segments, Ma first turning points and Mb second turning points, the N signal line segments are connected with each other, each of the Ma first turning points and the Mb second turning points is located at a connecting site of two adjacent signal line segments, wherein N and Ma are positive integers, Mb is a positive integer or 0, N≥3, Ma≥2, Ma+Mb≤N−1, and a resistance change rate between two adjacent signal line segments connected with each first turning point is ΔR, 0<|ΔR|≤10%.

A display device provided by another embodiment of the present invention has a display area and a peripheral area. The peripheral area is located at at least one side of the display area and includes an internal driving circuit area and a wiring area. The display device includes a pixel array, an internal driving circuit, and a plurality of signal lines. The pixel array is disposed in the display area. The internal driving circuit is disposed in the internal driving circuit area, and is electrically connected with the pixel array. The plurality of signal lines are disposed in the wiring area, and are electrically connected with the internal driving circuit and an external circuit, wherein each of these signal lines includes N signal line segments, Ma first turning points and Mb second turning points, the N signal line segments are connected with each other, and each of the Ma first turning points and the Mb second turning points is located at a connecting site of two adjacent signal line segments, wherein N and Ma are positive integers, Mb is a positive integer or 0, N≥3, Ma≥2, Ma+Mb≤N−1, and a width change rate between two adjacent signal line segments connected with each first turning point is ΔW, 0<|ΔW|≤10%.

Based on the above, in the display device of the present invention, by adjusting the layout design of the signal lines located in the wiring area and electrically connected with the external circuit and the internal driving circuit, the temperature rising degree of the signal lines can be effectively suppressed. In this way, the display device of the present invention can avoid the problem of safety due to excessive temperature, and can be beneficial to be designed with high resolution and slim border.

In order to make the aforementioned features and advantages of the disclosure more comprehensible, embodiments accompanied with figures are described in detail below.

DESCRIPTION OF THE EMBODIMENTS

Figure 1:
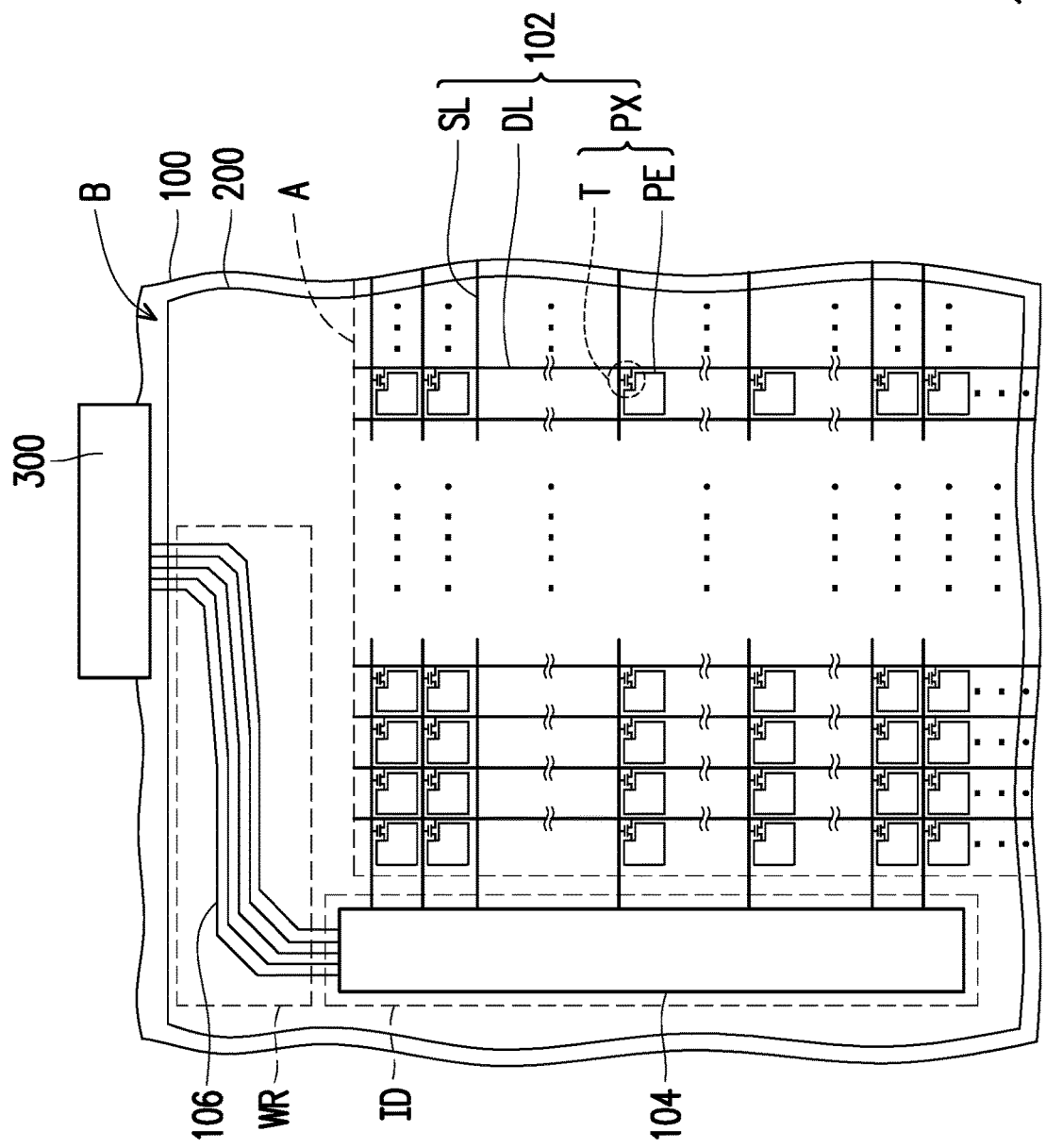
FIG. 1 is a schematic top view of a display device according to an embodiment of the invention.

Several embodiments of the disclosure will be disclosed below with reference to drawings. For clarity, many details in practice will be described together with the following description. However, it should be understood that these details in practice are not used to limit the disclosure. That is, in some embodiments of the disclosure, these details in practice are unnecessary. In addition, to simplify the drawings, some conventional structures and elements in the drawings will be shown in a simple and schematic manner.

The term "about," "approximately," "essentially" or "substantially" as used herein is inclusive of the stated value and means within an acceptable range of deviation for the particular value as determined by those skilled in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on optical properties, etching properties or other properties, instead of applying one standard deviation across all the properties.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (or coupled). Therefore, the electrical connection (or coupling) may be refer an intervening elements exist between two elements.

Unless otherwise defined, all terms (including technical and scientific terms) used herein have the same meaning as commonly understood by those skilled in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 2:
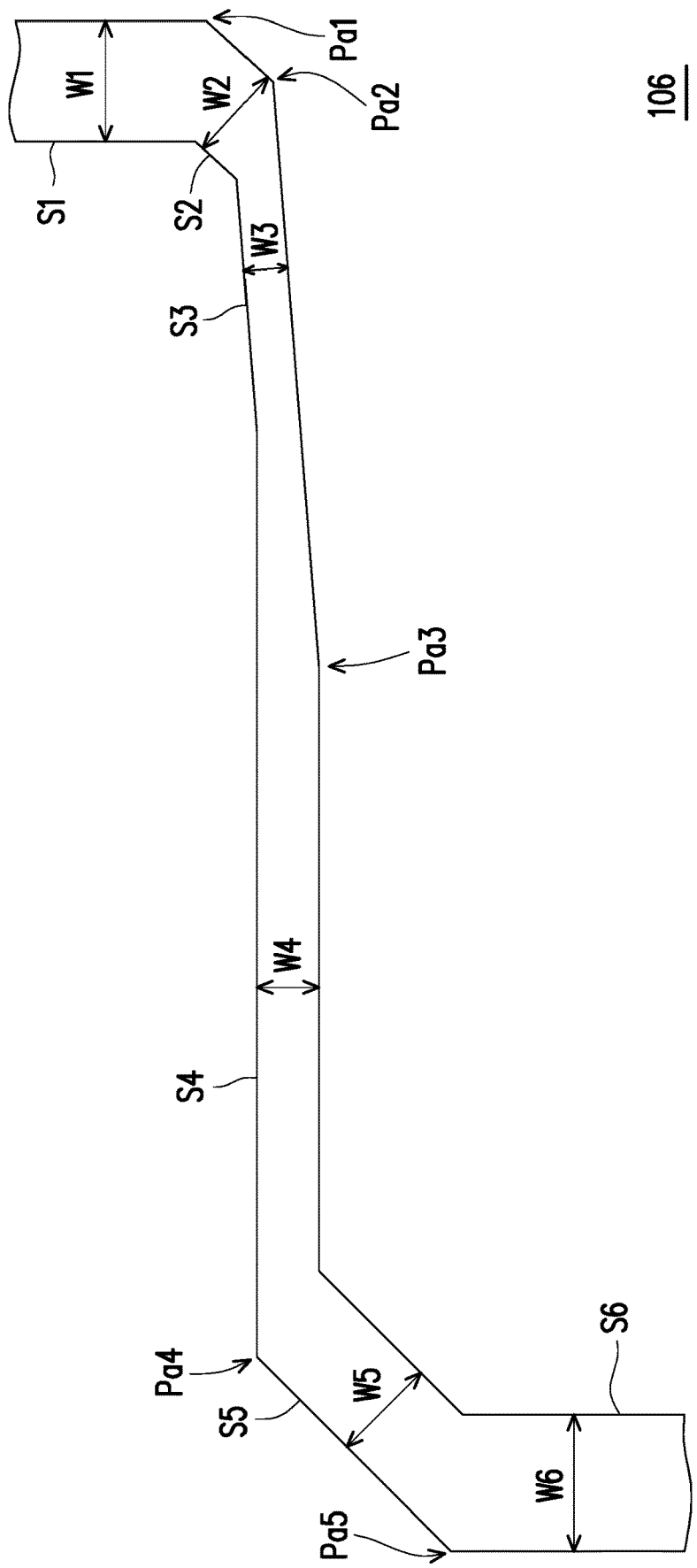
FIG. 2 is an enlarged schematic top view of one signal line in FIG. 1.

FIG. 1 is a schematic top view of a display device according to an embodiment of the invention. FIG. 2 is an enlarged schematic view of one signal line in FIG. 1.

Referring to FIG. 1, in the embodiment, the display device 10 may include a substrate 100, a pixel array 102, an internal driving circuit 104, a plurality of signal lines 106, a substrate 200 and an external circuit 300. From another point of view, as shown in FIG. 1, in the embodiment, the display device 10 may have a display area A and a peripheral area B located at at least one side of the display area A, wherein the peripheral area B includes an internal driving circuit area ID and a wiring area WR.

In the embodiment, the display device 10 may be a liquid crystal display device, a touch organic light-emitting display device, a touch inorganic light-emitting display device, a touch electrophoretic display device, or a touch plasma display device. To make the diagram clear, some other components that may exist and can be reasonably inferred according to the disclosure content of the present invention are omitted in FIG. 1. For example, the display medium is omitted in FIG. 1. In the embodiment, the display medium (not shown) may be disposed between the substrate 100 and the substrate 200. In addition, in the embodiment, the display medium (not shown) may be liquid crystal material, organic light-emitting material, inorganic light-emitting diode material, electrophoretic display material or plasma display material.

In the embodiment, the material of the substrate 100 may be glass, quartz, plastic or organic polymer. In the embodiment, the pixel array 102, the internal driving circuit 104 and the plurality of signal lines 106 are disposed on the substrate 100. In detail, as shown in FIG. 1, the pixel array 102 is disposed on the substrate 100 in the display area A, the internal driving circuit 104 is disposed on the substrate 100 in the internal driving circuit area ID, the plurality of signal lines 106 are disposed on the substrate 100 in the wiring area WR, and the external circuit 300 are electrically connected with the plurality of signal lines 106. In the embodiment, the substrate 100 and the pixel array 102, the internal driving circuit 104 and the plurality of signal lines 106 disposed on the substrate 100 may be regarded as a pixel array substrate. However, the present invention is not limited to the one depicted in FIG. 1, and the pixel array substrate of the display device 10 may be any pixel array substrate known to those skilled in the art for display devices. For example, in one embodiment, the color filter layer may be disposed on the substrate 100 to form a color filter on array (COA) pixel array substrate. In addition, in the embodiment, although FIG. 1 illustrates that the external circuit 300 is only partially disposed on the substrate 100, the present invention is not limited thereto. In other embodiments, the external circuit 300 may be disposed on the substrate 100 in the peripheral area B. In addition, in order to make the diagram clear, some components are omitted in FIG. 1, and those skilled in the art should understand that some components, such as bonding pads, fan-out lines, frame glue, etc., which can be reasonably inferred according to the disclosure content of the present invention may exist in the pixel array substrate of the display device 10.

In the embodiment, the substrate 200 and the substrate 100 are disposed opposite to each other. In the embodiment, the material of the substrate 200 may be glass, quartz, plastic or organic polymer. In addition, in the embodiment, the substrate 200 may be regarded as an opposite substrate. The substrate 200 may be any opposite substrate known to those skilled in the art for display devices. For example, in one embodiment, the substrate 200 may include, for example, a blank substrate and an element layer on the blank substrate. For example, in one embodiment, the element layer included in the substrate 200 may include, for example, a color filter layer, a wavelength conversion layer, a light-shielding pattern layer, a opposite electrode layer, or a combination thereof, but the invention is not limited thereto, and may be adjusted and changed depending on requirements.

In the embodiment, the pixel array 102 may include a plurality of scan lines SL, a plurality of data lines DL, and a plurality of pixel units PX arranged in an array. In the embodiment, the plurality of scan lines SL are not parallel to the plurality of data lines DL, that is, the plurality of scan lines SL and the plurality of data lines DL are disposed to cross each other. In order to make the diagram clear, the wring shown in FIG. 1 is only for schematic, and is not intended to limit the present invention. For example, the extending direction of the plurality of scan lines SL and the extending direction of the plurality of data lines DL in FIG. 1 are substantially perpendicular to each other, but the present invention is not limited thereto. The actual circuit layout of the plurality of scan lines SL and the plurality of data lines DL may be adjusted according to the architecture, requirements, etc., of the actual display device. In addition, the plurality of scan lines SL and the plurality of data lines DL may be located in different layers, and an insulating layer (not shown) may be interposed between the plurality of scan lines SL and the plurality of data lines DL. Based on conductivity considerations, the plurality of scan lines SL and the plurality of data lines DL are generally made of metal material. However, the present invention is not limited thereto. According to other embodiments, the plurality of scan lines SL and the plurality of data lines DL may be made of, for example, other conductive materials such as an alloy, a nitride of metal material, an oxide of metal material, an oxynitride of metal material, or a stack of said metal material and the aforementioned other conductive materials. In addition, in the embodiment, the plurality of scan lines SL and the plurality of data lines DL may have a single-layer structure or a multi-layer structure, respectively.

In the embodiment, each pixel unit PX is electrically connected with one of the plurality of scan lines SL and one of the plurality of data lines DL. In the embodiment, each pixel unit PX includes an active element T and a pixel electrode PE. The active element T may be any thin film transistor known to those skilled in the art, including, for example, a gate, a channel layer, a source and a drain (not labeled). In the embodiment, the pixel electrode PE is electrically connected with the active element T. The material of the pixel electrode PE may include (but not limited to): metal oxide conductive materials, such as indium tin oxide, indium zinc oxide, aluminum tin oxide, aluminum zinc oxide, indium gallium zinc oxide, other suitable oxides, or a stack of at least two of the above. In addition, FIG. 1 shows that the pixel electrode PE is a bulk electrode, but the present invention is not limited thereto. In other embodiments, the pixel electrode PE may be an electrode with a slit pattern.

In the embodiment, the internal driving circuit 104 is electrically connected with the pixel array 102. In detail, as shown in FIG. 1, the internal driving circuit 104 is electrically connected with the plurality of scan lines SL. In other words, in the embodiment, the internal driving circuit 104 may be a gate driver-on-array (GOA) or a gate driver integrated circuit (IC) for driving the pixel array 102, but the invention is not limited thereto.

In the embodiment, the external circuit 300 is electrically connected with the internal driving circuit 104. In detail, as shown in FIG. 1, the external circuit 300 is electrically connected with the internal driving circuit 104 through bonding pads (not shown) and then the plurality of signal lines 106. In the embodiment, the external circuit 300 is, for example, a driving chip, a control circuit, a flexible printed circuit (FPC) or a printed circuit board (PCB) provided with a driving chip, etc., so as to drive the pixel array 102. In addition, in the embodiment, the external circuit 300 may use a suitable process, such as: Chip On Glass (COG) process, Chip On Film (COF) process, Chip On Board (COB) process, Tape Automated Bonding (TAB), etc., to be connected with the substrate 100.

In the embodiment, the plurality of signal lines 106 are electrically connected with the external circuit 300 and the internal driving circuit 104, thereby transmitting the signal received from the external circuit 300 to the internal driving circuit 104 to drive the pixel array 102. In the embodiment where the internal driving circuit 104 is a gate driver-on-array, the signal line 106 may be a high-frequency signal line. However, the present invention is not limited thereto. In other embodiments, the signal line 106 may also be a start signal line, a low-frequency signal line, a low level signal line, or a constant voltage signal line. From another point of view, as shown in FIG. 1, the signal line 106 may be a wire on array (WOA), that is, the wiring area WR may be referred to as a WOA area, but the present invention is not limited thereto. Although FIG. 1 shows that five signal lines 106 are provided in the wiring area WR, the present invention does not limit the number of signal lines 106 and may be adjusted according to the actual structure and requirements of the display device 10.

Referring to FIG. 1 and FIG. 2, in the embodiment, each signal line 106 includes a signal line segment S1, a signal line segment S2, a signal line segment S3, a signal line segment S4, a signal line segment S5 and a signal line segment S6, in which the signal line segment S2 is directly connected between the signal line segment S1 and the signal line segment S3, the signal line segment S3 is directly connected between the signal line segment S2 and the signal line segment S4, the signal line segment S4 is directly connected between the signal line segment S3 and the signal line segment S5, and the signal line segment S5 is directly connected between the signal line segment S4 and the signal line segment S6. In other words, in the embodiment, each signal line 106 includes six signal line segments connected with each other. However, the present invention is not limited thereto, as long as each signal line 106 includes N signal line segments connected with each other, N is a positive integer and N≥3, it falls within the scope of the present invention.

In the embodiment, the signal line 106 includes a single-layer metal layer structure. That is to say, in the embodiment, the signal line segment S1, the signal line segment S2, the signal line segment S3, the signal line segment S4, the signal line segment S5 and the signal line segment S6 in each signal line 106 are formed by the same process and have the same material and thickness. Based on conductivity considerations, the plurality of signal lines 106 are generally made of a metal material, such as copper, aluminum, titanium or molybdenum. However, the present invention is not limited thereto. According to other embodiments, the plurality of signal lines 106 may be made of, for example, other conductive materials such as an alloy, a nitride of metal material, an oxide of metal material, an oxynitride of metal material, or a stack of said metal material and the aforementioned other conductive materials.

In the embodiment, each signal line 106 includes a turning point Pa1, a turning point Pa2, a turning point Pa3, a turning point Pa4 and a turning point Pa5. In detail, as shown in FIG. 2, the turning point Pa1 is located at the connecting site between the signal line segment S1 and the signal line segment S2, the turning point Pa2 is located at the connecting site between the signal line segment S2 and the signal line segment S3, the turning point Pa3 is located at the connecting site between the signal line segment S3 and the signal line segment S4, the turning point Pa4 is located at the connecting site between the signal line segment S4 and the signal line segment S5, and the turning point Pa5 is located at the connecting site between the signal line segment S5 and the signal line segment S6. In other words, in the embodiment, each of the turning point Pa1, the turning point Pa2, the turning point Pa3, the turning point Pa4 and the turning point Pa5 is located at the connecting site between two adjacent signal line segments. From another point of view, in the embodiment, two adjacent signal line segment S1 and signal line segment S2 are together connected to the turning point Pa1, two adjacent signal line segment S2 and signal line segment S3 are together connected to the turning point Pa2, two adjacent signal line segment S3 and the signal line segment S4 are together connected with the turning point Pa3, two adjacent signal line segment S4 and the signal line segment S5 are together connected with the turning point Pa4, and two adjacent signal line segment S5 and the signal line segment S6 are together connected with the turning point Pa5. From yet another point of view, in the embodiment, the turning point Pa1 may be regarded as one end point of the signal line segment S1, the turning point Pa1 and the turning point Pa2 may be regarded as the opposite end points of the signal line segment S2, the turning point Pa2 and the turning point Pa3 may be regarded as the opposite end points of the signal line segment S3, the turning point Pa3 and the turning point Pa4 may be regarded as the opposite end points of the signal line segment S4, the turning point Pa4 and the turning point Pa5 may be regarded as the opposite end points of the signal line segment S5, and the turning point Pa5 may be regarded as one end point of the signal line segment S6.

In the embodiment, as shown in FIG. 2, the width W1 of the signal line segment S1 is greater than the width W2 of the signal line segment S2, the width W2 of the signal line segment S2 is greater than the width W3 of the signal line segment S3, the width W3 of the signal line segment S3 is smaller than the width W4 of the signal line segment S4, the width W4 of the signal line segment S4 is smaller than the width W5 of the signal line segment S5, and the width W5 of the signal line segment S5 is smaller than the width W6 of the signal line segment S6. That is to say, in the embodiment, the widths of two adjacent signal line segments are different from each other, that is, there is a width change rate ΔW between the two adjacent signal line segments. Herein, "width" is defined as: from the top view (that is, from the direction perpendicular to the substrate 100), in the direction perpendicular to the extension direction of the opposite and parallel side surfaces of the signal line segment, the distance between the opposite and parallel side surfaces of the signal line segment. In addition, herein, "width change rate ΔW" refers to the value obtained by substituting a width dimension a of a signal line segment which the signal passes first and a width dimension b of an adjacent signal line segment which the signal passes later along the signal transmission direction from the external circuit 300 to the internal driving circuit 104, or the signal transmission direction from the internal driving circuit 104 to the external circuit 300 into the following formula: ΔW (%)=100×(b−a)/a.

Specifically, in the embodiment, the absolute value of the width change rate ΔW between the width W1 of the signal line segment S1 and the width W2 of the signal line segment S2 is greater than 0 and less than or equal to 10%, the absolute value of the width change rate ΔW between the width W2 of the signal line segment S2 and the width W3 of the signal line segment S3 is greater than 0 and less than or equal to 10%, the absolute value of the width change rate ΔW between the width W3 of the signal line segment S3 and the width W4 of the signal line segment S4 is greater than 0 and less than or equal to 10%, the absolute value of the width change rate ΔW between the width W4 of the signal line segment S4 and the width W5 of the signal line segment S5 is greater than 0 and less than or equal to 10%, and the absolute value of the width change rate ΔW between the width W5 of the signal line segment S5 and the width W6 of the signal line segment S6 is greater than 0 and less than or equal to 10%. That is to say, in the embodiment, the width change rate ΔW between two adjacent signal line segments connected with each of the turning point Pa1, the turning point Pa2, the turning point Pa3, the turning point Pa4, and the turning point Pa5 meets the following condition: 0<|ΔW|≤10%. In other words, in the embodiment, the width change rate ΔW between two adjacent signal line segments corresponding to each turning point in each signal line 106 meets the above condition.

As mentioned above, the width change rate ΔW between two adjacent signal line segments corresponding to each of the opposite end points (i.e., the turning point Pa2 and the turning point Pa3) of the signal line segment S3 meets the above condition. That is to say, in the embodiment, the width change rate ΔW between two adjacent signal line segments corresponding to each of the opposite end points (i.e., the turning point Pa2 and the turning point Pa3) of the signal line segment S3 with the minimum width W3 among the signal line segments S1-S6 meets the above condition.

On the other hand, in the embodiment, the resistance change rate ΔR between two adjacent signal line segments connected with each of the turning point Pa1, the turning point Pa2, the turning point Pa3, the turning point Pa4 and the turning point Pa5 meets the following conditions: 0<|ΔR|≤10%. This indicates that in the embodiment, the width change rate ΔW between two adjacent signal line segments connected with each of the turning point Pa1, the turning point Pa2, the turning point Pa3, the turning point Pa4 and the turning point Pa5 directly corresponds to the resistance change rate ΔR between two adjacent signal line segments connected with each of turning point Pa1, turning point Pa2, turning point Pa3, turning point Pa4 and turning point Pa5.

Those skilled in the art can understand the following relationship formula (1): $R/L = \rho/W \times t$, wherein R/L represents the resistance value per unit length, $\rho$ represents the resistivity of the metal material, W represents the width of the trace and t represents the thickness of the trace. It can be seen from the above relationship formula (1) that when the plurality of signal lines 106 are formed, the resistivity $\rho$, width W (i.e., widths W1-W6) and thickness t of each of the signal line segments S1-S6 are determined, so in the embodiment where the signal line segments S1-S6 have the same material (i.e., the same resistivity $\rho$) and the same thickness t, when the width W of any one of the signal line segments S1-S6 changes, the corresponding resistance value per unit length R/L changes accordingly, and there is an inverse relationship between the width W and the resistance value per unit length R/L. In view of this, by confirming the absolute value of the width change rate ΔW between two adjacent signal line segments, the absolute value of the resistance change rate ΔR between two adjacent signal line segments can be learned. Herein, "resistance change rate ΔR" refers to the value obtained by substituting a resistance value c per unit length of a signal line segment which the signal passes first and a resistance value d per unit length of an adjacent signal line segment which the signal passes later along the signal transmission direction from the external circuit 300 to the internal driving circuit 104, or the signal transmission direction from the internal driving circuit 104 to the external circuit 300 into the following formula: ΔR (%)=100×(d−c)/c.

As described above, in the embodiment, the width change rate ΔW between two adjacent signal line segments corresponding to each of the turning points Pa1-Pa5 in each signal line 106 meets the condition of 0<|ΔW|≤10%. However, the present invention is not limited thereto, as long as each signal line 106 includes N signal line segments, Ma first turning points and Mb second turning points, wherein the N signal line segments are connected with each other, each of the Ma first turning points and the Mb second turning points is located at the connecting site of two adjacent signal line segments, N and Ma are positive integers, Mb is a positive integer or 0, N≥3, Ma≥2, Ma+Mb≤N−1, and the resistance change rate ΔR between two adjacent signal line segments connected with each first turning point meets the condition of 0<|ΔR|≤10% or the width change rate ΔW between two adjacent signal line segments connected with each first turning point meets the condition of 0<|ΔW|≤10%, it falls within the scope of the present invention. That is to say, in other embodiments, each signal line 106 may include other turning points different from the turning points Pa1-Pa5, that is, each signal line 106 may include a turning structure of which the resistance change rate ΔR between two adjacent signal line segments does not meet the condition of $0<|\Delta R|\leq 10\%$ or the width change rate $\Delta W$ between two adjacent signal line segments does not meet the condition of $0<|\Delta W|\leq 10\%$.

Figure 3:
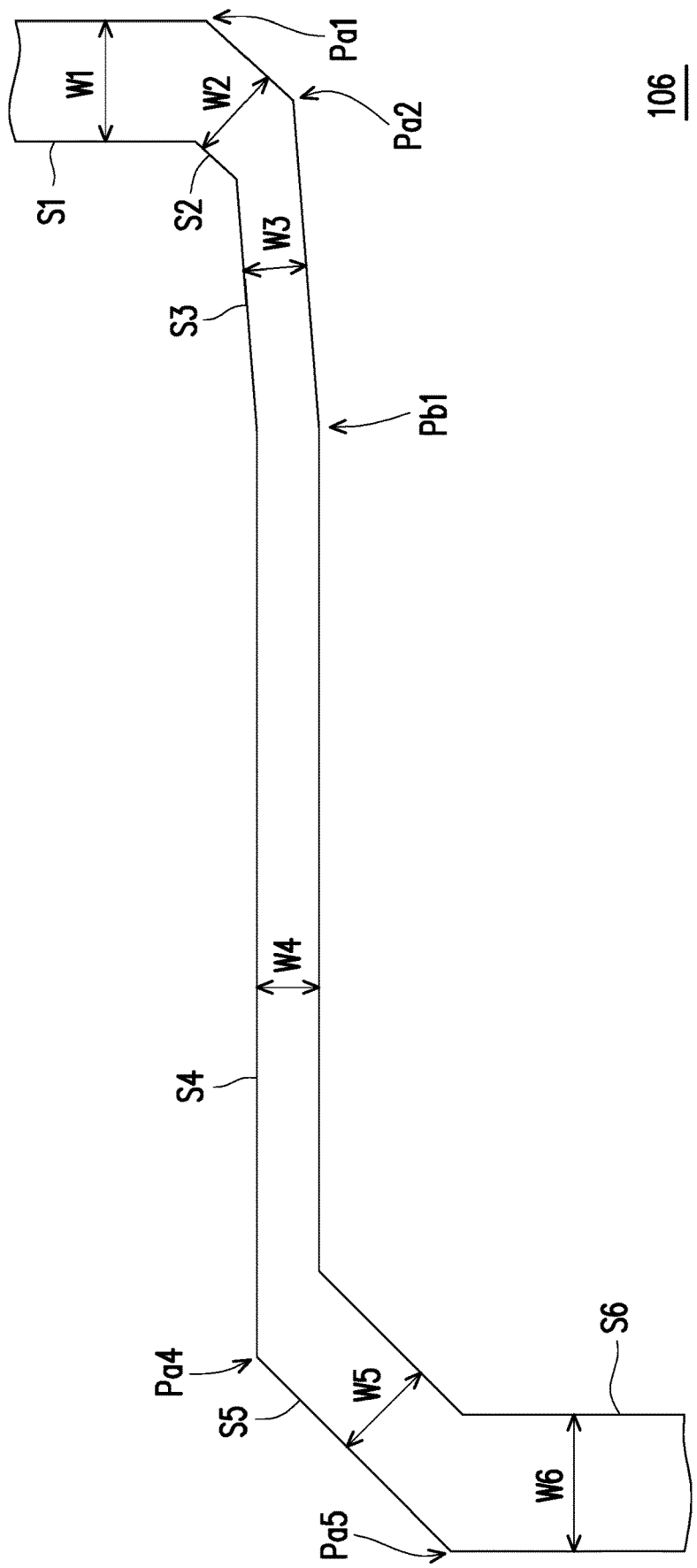
FIG. 3 is an enlarged schematic top view of one signal line according to another embodiment of the invention.

For example, please refer to FIG. 3, the signal line 106 of this embodiment is similar to the signal line 106 of FIG. 2, the main difference between the two lies in that the signal line 106 of FIG. 3 includes a turning point Pb1, and the width change rate $\Delta W$ between the adjacent signal line segment S3 and the signal line segment S4 connected with the turning point Pb1 is equal to 0, that is, the width W3 of the signal line segment S3 and the width W4 of the signal line segment S4 are substantially the same. Based on the previous description, it can be known that the turning points Pa1-Pa5 are the so-called first turning points, and the turning point Pb1 is the so-called second turning point. In view of this, in the embodiment of FIG. 2, the turning points Pa1-Pa5 (i.e., the first turning point) in each signal line 106 exist in a continuous configuration, and in the embodiment of FIG. 3, the turning points Pa1-Pa2 and Pa4-Pa5 (i.e., the first turning point) in each signal line 106 exist in a discontinuous configuration, because the turning point Pb1 is located between the turning point Pa2 and the turning point Pa4.

Furthermore, in the embodiment of FIG. 3, only four turning structures among the turning structures corresponding to the five turning points (i.e., turning point Pa1, turning point Pa2, turning point Pa4, turning point Pa5, turning point Pb1) of the signal line 106 meet the following condition: the absolute value of the width change rate $\Delta W$ between two adjacent signal line segments being greater than 0 and less than or equal to 10%. In other words, in the embodiment of FIG. 3, only four turning structures among the turning structures corresponding to the five turning points (i.e., turning point Pa1, turning point Pa2, turning point Pa4, turning point Pa5, turning point Pb1) of the signal line 106 meet the following condition: the absolute value of the resistance change rate $\Delta R$ between two adjacent signal line segments being greater than 0 and less than or equal to 10%. From another point of view, in the embodiment of FIG. 3, not all the width change rates $\Delta W$ corresponding to the opposite end points (i.e., the turning point Pa2 and the turning point Pb1) of the signal line segment S3 with the minimum width W3 among the signal line segments S1-S6 meet the condition of $0<|\Delta W|\leq 10\%$.

Based on the foregoing description, it can be seen that in the embodiment of FIG. 2, each signal line 106 meets the following conditions: N=6, Ma=5, Mb=0, and Ma+Mb=N−1; and in the embodiment of FIG. 3, each signal line 106 meets the following conditions: N=6, Ma=4, Mb=1 and Ma+Mb=N−1. However, the present invention is not limited thereto, as mentioned above, as long as N and Ma are positive integers, Mb is a positive integer or 0, N≥3, Ma≥2, Ma+Mb≤N−1, it falls within the scope of the present invention. That is to say, in the display device of the present invention, each signal line 106 includes at least two first turning points, and the turning structures corresponding to such at least two first turning points each conform to the following condition: the absolute value of the width change rate $\Delta W$ between two adjacent signal line segments being greater than 0 and less than or equal to 10%, or the absolute value of the resistance change rate $\Delta R$ between two adjacent signal line segments being greater than 0 and less than or equal to 10%. In this way, in the display device of the present invention, the impedance matching between the plurality of signal line segments in each signal line 106 in the wiring area WR can be improved, so that the temperature rising degree of the signal lines 106 can be effectively suppressed.

Thereby, the safety problem of the display device of the present invention due to excessive temperature can be avoided, and the display device of the present invention can be beneficial to be designed with high resolution and slim border. In some embodiments, each signal line 106 in the wiring area WR of the display device of the present invention includes at least two first turning points, such that compared with the conventional display device, the temperature of the signal lines 106 in the display device of the present invention can be reduced by at least about 2.7° C.

In addition, as described above, in the embodiment of FIG. 2, the width change rate $\Delta W$ between two adjacent signal line segments corresponding to each of the opposite end points (i.e., the turning point Pa2 and the turning point Pa3) of the signal line segment S3 with the minimum width W3 among the signal line segments S1-S6 meets the condition of $0<|\Delta W|\leq 10\%$; and in the embodiment of FIG. 3, not all the width change rates $\Delta W$ corresponding to the opposite end points (i.e., the turning point Pa2 and the turning point Pb1) of the signal line segment S3 with the minimum width W3 among the signal line segments S1-S6 meet the condition of $0<|\Delta W|\leq 10\%$. In this way, the display device corresponding to the embodiment of FIG. 2 can suppress the temperature rising degree of the signal lines 106 to a greater extent than the display device corresponding to the embodiment of FIG. 3. That is to say, in the display device of the present invention, the opposite ends of the signal line segment with the minimum width (i.e., the maximum resistance value) among the signal line segments of each signal line 106 in the wiring area WR all are the first turning points, thereby the temperature rising degree of the signal lines 106 can effectively suppressed.

In the following, in order to prove that the design of the display device of the present invention can indeed achieve the effective suppression of the degree of rising temperature of the signal lines in the wiring area, the display devices of Examples 1 to 2 and the display devices of Comparative Examples 1 to 2 are specifically used to undergo the temperature simulation test on the signal lines in the wiring area, please refer to Table 1 and Table 2 below. In the display devices of Examples 1 and 2 and the display devices of Comparative Examples 1 and 2, each signal line in the wiring area includes a single-layer metal layer structure, and from the external circuit to the internal driving circuit, each signal line in the wiring area includes four signal line segments (i.e., signal line segment WOA1, signal line segment WOA2, signal line segment WOA3, and signal line segment WOA4), wherein a turning point is located between any two adjacent signal line segments.

TABLE 1

| | Width (μm) | | | |
| --- | --- | --- | --- | --- |
| | Signal line segment WOA1 | Signal line WOA2 | Signal line WOA3 | Signal line segment WOA4 |
| Example 1 | 70 | 65 | 60 | 55 |
| Example 2 | 90 | 70 | 75 | 70 |
| Comparative Example 1 | 60 | 30 | 60 | 80 |
| Comparative Example 2 | 60 | 50 | 50 | 50 |

TABLE 2

|  | Example 1 | Example 2 | Comparative Example 1 | Comparative Example 2 |
|---|---|---|---|---|
| The temperature of the signal lines in the wiring area (° C.) | 43.8 | 48.3 | 69.7 | 51.0 |

It can be seen from the simulation results in Table 2 that the signal lines in the wiring area of Examples 1-2 have a lower temperature compared to Comparative Examples 1-2. That is, the degree of rising temperature of the signal lines in the wiring area of Examples 1-2 is reduced.

This result confirms that in the display device of the present invention, each signal line in the wiring area is designed to include N signal line segments, Ma first turning points and Mb second turning points, wherein the N signal line segments are connected with each other, each of the Ma first turning points and the Mb second turning points is located at the connecting site of two adjacent signal line segments, N and Ma are positive integers, Mb is a positive integer or 0, N≥3, Ma≥2, Ma+Mb≤N−1, and the resistance change rate ΔR between two adjacent signal line segments connected with each first turning point meets the condition of 0<|ΔR|≤10% or the width change rate ΔW between two adjacent signal line segments connected with each first turning point meets the condition of 0<ΔW|≤10%, thereby the temperature rising degree of the signal lines in the wiring area can indeed be effectively suppressed to improve safety.

In addition, according to the foregoing description of FIGS. 1 to 3 and the simulation results, those skilled in the art should understand that the design of the display device of the present invention is not limited to those depicted in FIG. 2 and FIG. 3, as long as each signal line in the wiring area includes N signal line segments, Ma first turning points and Mb second turning points, wherein the N signal line segments are connected with each other, each of the Ma first turning points and the Mb second turning points is located at the connecting site between two adjacent signal line segments, N and Ma are positive integers, Mb is a positive integer or 0, N≥3, Ma≥2, Ma+Mb≤N−1, and the resistance change rate ΔR between two adjacent signal line segments connected with each first turning point meets the condition of 0<|ΔR|≤10% or the width change rate ΔW between two adjacent signal line segments connected with each first turning point meets the condition of 0<ΔW|≤10%, it falls within the scope of the present invention. That is to say, those skilled in the art should be able to design the specific structure of each signal line in the wiring area based on the actual display device architecture and requirements based on the existing technical level and the disclosure of this application.

In addition, in the embodiment of FIG. 2 or FIG. 3, the signal line 106 includes a single-layer metal layer structure, but the present invention is not limited thereto. Hereinafter, other embodiments will be described in detail with reference to FIGS. 4 to 6. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 4:
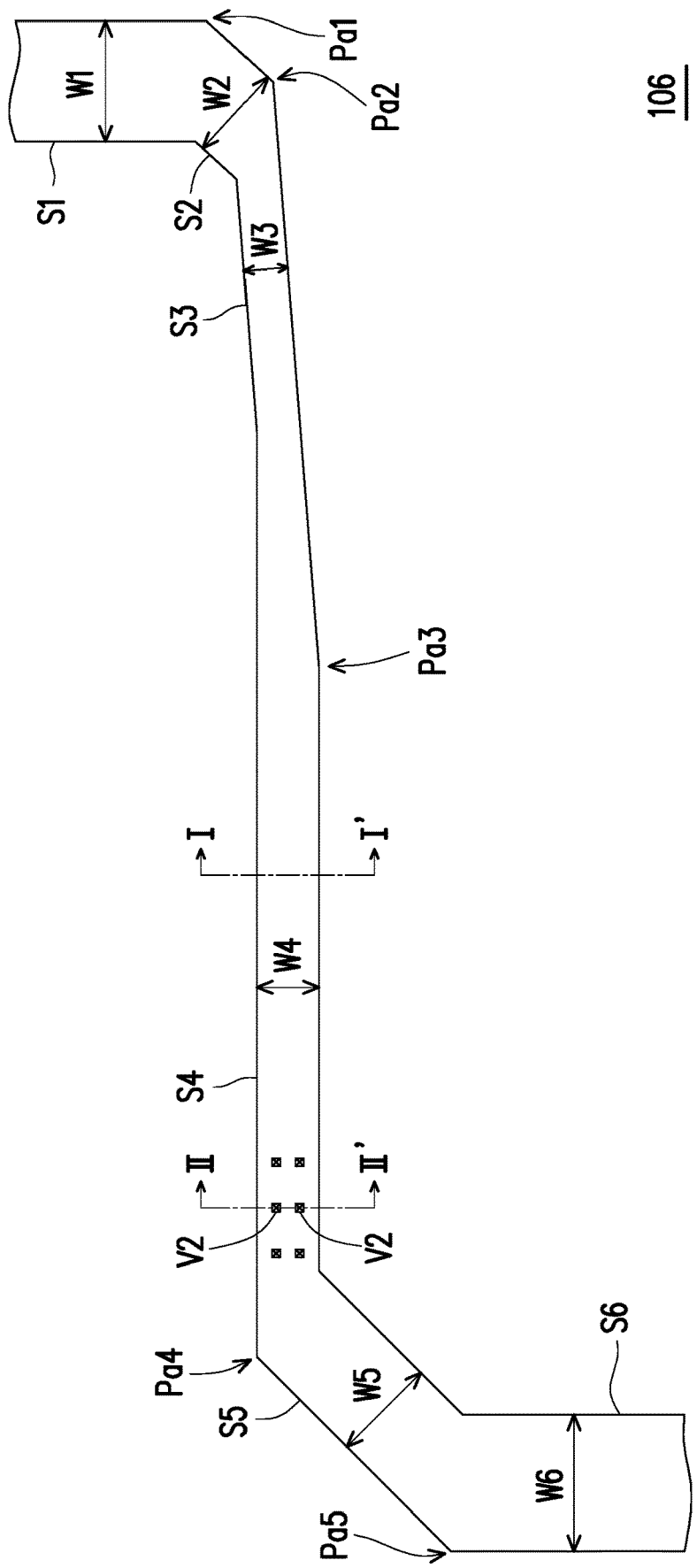
FIG. 4 is an enlarged schematic top view of one signal line according to another embodiment of the invention.
Figure 6:
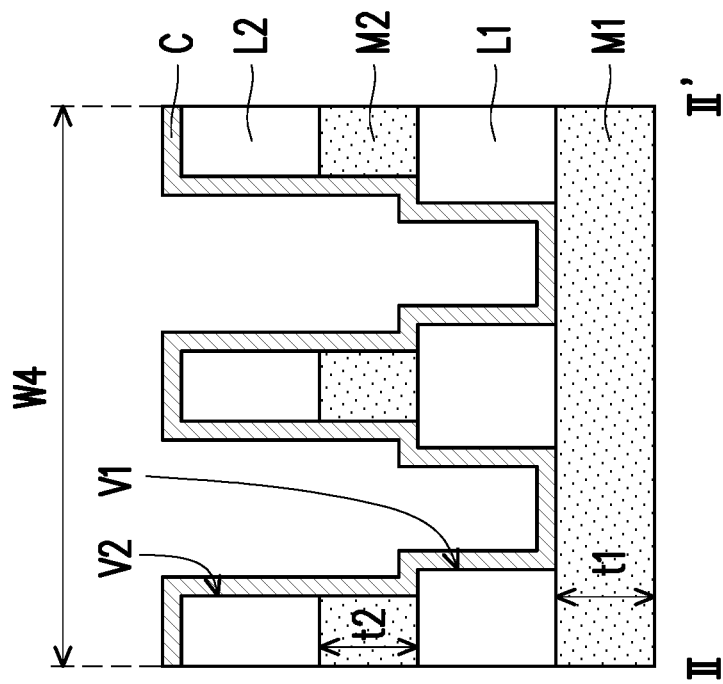
FIG. 6 is a schematic cross-sectional view taken along a section line II-II' of FIG. 4.
Figure 5:
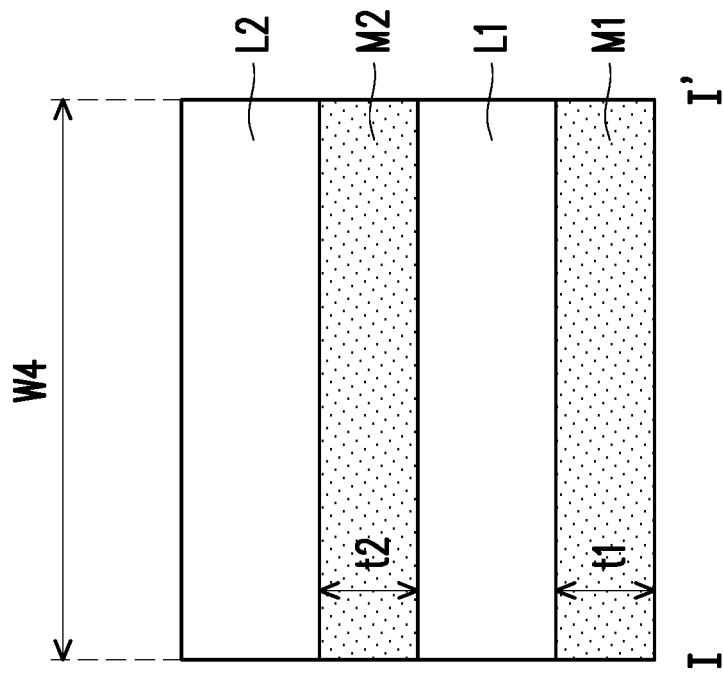
FIG. 5 is a schematic cross-sectional view taken along a section line I-I' of FIG. 4.

FIG. 4 is an enlarged schematic diagram of one signal line according to another embodiment of the invention. FIG. 5 is a schematic cross-sectional view taken along a section line I-I' of FIG. 4. FIG. 6 is a schematic cross-sectional view taken along a section line II-II' of FIG. 4. Referring to FIG. 4 and FIG. 2, the signal line 106 of FIG. 4 is similar to the signal line 106 of FIG. 2, and therefore identical or similar elements are denoted by identical or similar reference numerals, and the description of the same technical contents is omitted. The omitted part of the description can refer to the foregoing embodiments. Hereinafter, the difference between the signal line 106 of FIG. 4 and the signal line 106 of FIG. 2 will be described.

Referring to FIG. 4 to FIG. 6, in the embodiment, the signal line 106 includes a double-layer metal layer structure. It is worth mentioning that although the signal line segment S4 is used as an example to illustrate the double-layer metal layer structure, according to the following description based on FIG. 5 and FIG. 6, those skilled in the art should understand that the specific structure of each of the signal line segments S1-S3, S5-S6, that is, each of the signal line segments S1-S3, S5-S6 includes a double-layer metal layer structure.

In detail, as shown in FIG. 5 and FIG. 6, the double-layer metal layer structure includes a first metal layer M1, a second metal layer M2, and an insulation layer L1 between the first metal layer M1 and the second metal layer M2. Based on conductivity considerations, the first metal layer M1 and the second metal layer M2 are generally made of metal material, such as copper, aluminum, titanium or molybdenum. However, the present invention is not limited thereto, according to other embodiments, the first metal layer M1 and the second metal layer M2 may be made of, for example, other conductive materials such as an alloy, a nitride of metal material, an oxide of metal material, an oxynitride of metal material, or a stack of said metal material and the aforementioned other conductive materials. In the embodiment, the material of the first metal layer M1 is substantially the same as the material of the second metal layer M2. However, the present invention is not limited thereto. In other embodiments, the material of the first metal layer M1 may be different from the material of the second metal layer M2. In addition, in the embodiment, the thickness t1 of the first metal layer M1 is substantially the same as the thickness t2 of the second metal layer M2. However, the present invention is not limited thereto. In other embodiments, the thickness t1 of the first metal layer M1 may be different from the thickness t2 of the second metal layer M2. The material of the insulating layer L1 may include inorganic materials, organic materials, or other suitable materials, wherein the inorganic materials include (but are not limited to): silicon oxide, silicon nitride, or silicon oxynitride, and the organic materials include (but are not limited to): polyimide-based resin, epoxy-based resin or acrylic-based resin.

Further, please refer to FIG. 4 and FIG. 6, the second metal layer M2 is electrically connected with the first metal layer M1 through a contact structure C. That is to say, in the signal line 106 of the embodiment, the contact structure C for electrically connecting the first metal layer M1 and the second metal layer M2 is disposed in the signal line segment S4. However, the present invention is not limited thereto. In other embodiments, the contact structure C may be provided in at least one of the signal line segments S1-S3, S5-S6. In detail, as shown in FIG. 6, by disposing the contact structure C in a contact window V1 of the insulating layer L1 and a contact window V2 of the insulating layer L2, the second metal layer M2 is electrically connected with the first metal layer M1 the first metal layer M1. In other words, the contact structure C is directly connected with the first metal layer M1 and the second metal layer M2 through the contact window V1 and the contact window V2. From another point of view, in the embodiment, when the signal line 106 is used to transmit signals, the first metal layer M1 and the second metal layer M2 are arranged in parallel. In view of this, in the embodiment, the signal line segment S4 can be regarded as being obtained by the parallel connection of the portion of the first metal layer M1 corresponding to the signal line segment S4 and the portion of the second metal layer M2 corresponding to the signal line segment S4, and the configurations of the signal line segments S1-S3, S5-S6 are deduced by analogy. The material of the contact structure C may include metal oxide, such as indium tin oxide, indium zinc oxide, or indium gallium zinc oxide. The material of the insulating layer L2 may include inorganic materials, organic materials, or other suitable materials, wherein the inorganic materials include (but are not limited to): silicon oxide, silicon nitride, or silicon oxynitride, and the organic materials include (but are not limited to): polyimide-based resin, epoxy-based resin or acrylic-based resin. In addition, the configuration in which the second metal layer M2 is electrically connected with the first metal layer M1 through the contact structure C is not limited to that shown in FIG. 6. For example, FIG. 6 shows that one insulating layer L2 is disposed between the contact structure C and the second metal layer M2, but the present invention is not limited thereto. In other embodiments, two or more insulating layers may be provided between the contact structure C and the second metal layer M2. In yet other embodiments, other insulating layers may be provided on the contact structure C.

It can be seen from the above relationship formula (1) that when the plurality of signal lines 106 are formed, the resistivity ρ, width W (i.e., widths W1-W6) and thickness t (i.e., thicknesses t1-t2) of each of the signal line segments S1-S6 are determined, so in the embodiment where the first metal layer M1 and the second metal layer M2 are arranged in parallel, and the first metal layer M1 and the second metal layer M2 have the same material (i.e., the same resistivity ρ) and the same thickness t (which means that the thickness t1 is equal to the thickness t2), when the width W of any one of the signal line segments S1-S6 changes, the corresponding resistance value per unit length R/L changes accordingly, and there is an inverse relationship between the width W and the resistance value per unit length R/L. In view of this, by confirming the absolute value of the width change rate ΔW between two adjacent signal line segments, the absolute value of the resistance change rate ΔR between two adjacent signal line segments can be learned.

As mentioned above, in other embodiments, the thickness t1 of the first metal layer M1 may be different from the thickness t2 of the second metal layer M2. Even so, in the case where the first metal layer M1 and the second metal layer M2 are arranged in parallel, and the first metal layer M1 and the second metal layer M2 have the same material (i.e., the same resistivity ρ), by confirming the absolute value of the width change rate ΔW between two adjacent signal line segments, the absolute value of the resistance change rate ΔR between two adjacent signal line segments can still be learned. That is, regardless of whether the thickness t1 of the first metal layer M1 is the same as the thickness t2 of the second metal layer M2, the absolute value of the resistance change rate ΔR between two adjacent signal line segments can be learned by confirming Know the absolute value of the width change rate ΔW between adjacent signal line segments.

In addition, as described above, in other embodiments, the material of the first metal layer M1 may be different from the material of the second metal layer M2. Accordingly, from the above relationship formula (1), it can be seen that the resistance value per unit length R/L is affected by both the width W and the resistivity ρ, that is, the absolute value of the resistance change rate between two adjacent signal line segments cannot be learned from the absolute value of the width change rate ΔW between two adjacent signal line segments.

In addition, in the embodiment of FIG. 2 or FIG. 3, the signal line 106 includes a single-layer metal layer structure, and in the embodiment of FIG. 4, the signal line 106 includes a double-layer metal layer structure, but the present invention is not limited thereto. In other embodiments, the signal line 106 may include both of a single-layer metal layer structure and a double-layer metal layer structure.

In addition, in the embodiment of FIG. 2, FIG. 3 or FIG. 4, the structure of each signal line 106 is a single bar structure, but the present invention is not limited thereto. Hereinafter, other embodiments will be described in detail with reference to FIG. 7. It should be noted that the reference numerals and some descriptions in the previous embodiment are used in the following embodiments, in which identical or similar reference numerals indicate identical or similar elements, and repeated description of the same technical contents is omitted. The omitted part of the description can refer to the foregoing embodiments, which is not repeated in the following embodiments.

Figure 7:
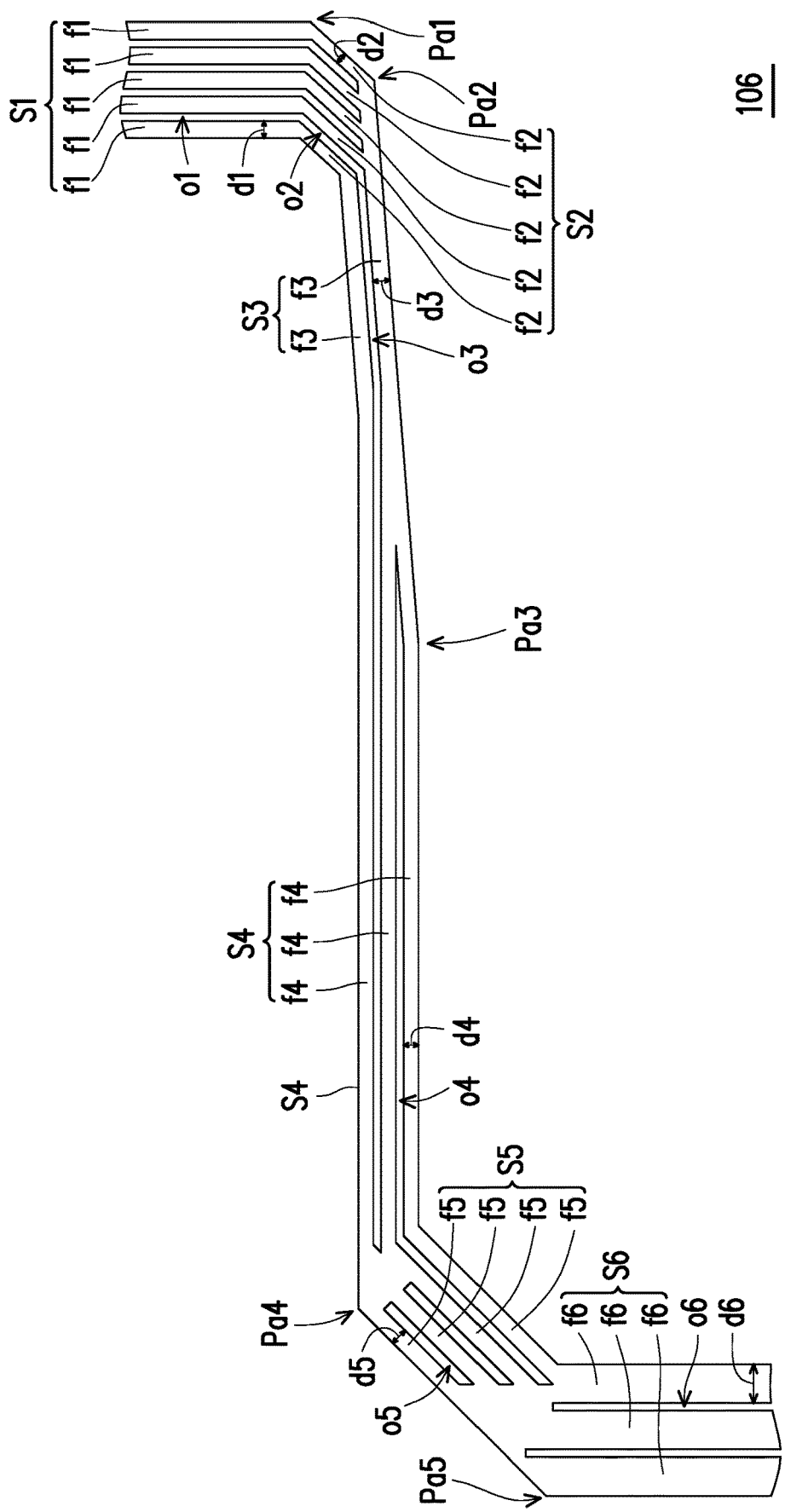
FIG. 7 is an enlarged schematic top view of one signal line according to another embodiment of the invention.

FIG. 7 is an enlarged schematic top view of one signal line according to another embodiment of the invention. Referring to FIG. 7 and FIG. 2, the signal line 106 of FIG. 7 is similar to the signal line 106 of FIG. 2, and therefore identical or similar elements are denoted by identical or similar reference numerals, and the description of the same technical contents is omitted. The omitted part of the description can refer to the foregoing embodiments. Hereinafter, the difference between the signal line 106 of FIG. 7 and the signal line 106 of FIG. 2 will be described.

Referring to FIG. 7, in the embodiment, the signal line segment S1 includes a plurality of strip portions f1 arranged parallel to each other, and a gap o1 is located between two adjacent strip portions f1; the signal line segment S2 includes a plurality of strip portions f2 arranged parallel to each other, and a gap o2 is located between two adjacent strip portions f2; the signal line segment S3 includes a plurality of strip portions f3 arranged parallel to each other, and a gap o3 is located between two adjacent strip portions f3; the signal line segment S4 includes a plurality of strip portions f4 arranged parallel to each other, and a gap o4 is located between two adjacent strip portions f4; the signal line segment S5 includes a plurality of strip portions f5 arranged parallel to each other, and a gap o5 is located between two adjacent strip portions f5; the signal line segment S6 includes a plurality of strip portions f6 arranged parallel to each other, and a gap o6 is located between two adjacent strip portions f6.

In view of this, in the embodiment, the width of the signal line segment S1 is the sum of the widths d1 of the plurality of strip portions f1, the width of the signal line segment S2 is the sum of the widths d2 of the plurality of strip portions f2, and the width of the signal line S3 The sum of the widths d3 of the plurality of strip portions f3, the width of the signal line segment S4 is the sum of the widths d4 of the plurality of strip portions f4, the width of the signal line segment S5 is the sum of the widths d5 of the plurality of strip portions f5, and the width of the signal line segment S6 The width is the sum of the widths d6 of the plurality of strip portions f6.

It can be known from the above relationship formula (1) that when the plurality of signal lines 106 are formed, the resistivity ρ, width W (that is, the sum of the widths d1 of the strip portions f1, the sum of the widths d2 of the strip portions f2, the sum of the widths d3 of the strip portions f3, the sum of the widths d4 of the strip portions f4, the sum of the widths d5 of the strip portions f5, the sum of the widths d6 of the strip portions f6) and the thickness t of each of the signal line segments S1-S6 are determined, so in the embodiment where the signal line segments S1-S6 have the same material (i.e., the same resistivity ρ) and the same thickness t, when the width W of any one of the signal line segments S1-S6 changes, the corresponding resistance value per unit length R/L changes accordingly, and the width W is inversely proportional to the resistance value per unit length R/L. In view of this, by confirming the absolute value of the width change rate ΔW between two adjacent signal line segments, the absolute value of the resistance change rate ΔR between two adjacent signal line segments can be learned.

As shown in FIG. 7, in the embodiment, the number of strip portions f1 is five, the number of strip portions f2 is five, the number of strip portions f3 is two, and the number of strip portions f4 is three, the number of strip portions f5 is four, and the number of strip portions f6 is three. In addition, as shown in FIG. 7, in the embodiment, the widths d1 of the plurality of strip portions f1 are the same as each other, the widths d2 of the plurality of strip portions f2 are the same as each other, the widths d3 of the plurality of strip portions f3 are the same as each other, the widths d4 of the plurality of strip portions f4 are the same as each other, the widths d5 of the plurality of strip portions f5 are the same as each other, and the widths d6 of the plurality of strip portions f6 are the same as each other. In addition, as shown in FIG. 7, in the embodiment, the sum of the widths d1 of the plurality of strip portions f1 is greater than the sum of the widths d2 of the plurality of strip portions f2, the sum of the widths d2 of the plurality of strip portions f2 is greater than the sum of the widths d3 of the strip portions f3, the sum of the widths d3 of the strip portions f3 is smaller than the sum of the widths d4 of the strip portions f4, the sum of the widths d4 of the strip portions f4 is smaller than the widths of the strip portions f5, and the sum of the widths d5 of the plurality of strip portions f5 is smaller than the sum of the widths d6 of the plurality of strip portions f6. However, the present invention is not limited to those depicted in FIG. 7. Based on the descriptions of the foregoing embodiments, it can be known that as long as each signal line 106 includes N signal line segments, Ma first turning point and Mb second turning point, wherein the N signal line segments are connected with each other, each of the Ma first turning points and the Mb second turning points is located at the connecting site of two adjacent signal line segments, N and Ma are positive integers, Mb is positive integer or 0, N≥3, Ma≥2, Ma+Mb≤N−1, and the resistance change rate ΔR between two adjacent signal line segments connected with each first turning point meets the condition of 0<|ΔR|10% or the width change rate ΔW between two adjacent signal line segments connected with each first turning point meets the condition of 0<|ΔW|≤10%, it falls within the scope of the present invention.

In summary, in the display device of the above embodiments, by adjusting the layout design of the signal lines located in the wiring area and electrically connected with the external circuit and the internal drive circuit, the temperature rising degree of the signal lines can be effectively suppressed. In this way, the display device of the present invention can avoid the problem of safety due to excessive temperature, and can be beneficial to be designed with high resolution and slim border.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A display device having a display area and a peripheral area, the peripheral area being located at at least one side of the display area and including an internal driving circuit area and a wiring area, wherein the display device includes:
    a pixel array disposed in the display area;
    an internal driving circuit disposed in the internal driving circuit area and electrically connected with the pixel array; and
    a plurality of signal lines disposed in the wiring area, and the electrically connected with the internal driving circuit and an external circuit,
    wherein each of the signal lines includes N signal line segments, Ma first turning points and Mb second turning points, the N signal line segments are connected with each other, each of the Ma first turning points and the Mb second turning points is located at a connecting site of two adjacent signal line segments, wherein N and Ma are positive integers, Mb is a positive integer or 0, N≥3, Ma≥2, Ma+Mb≤N−1, and a resistance change rate between two adjacent signal line segments connected with each first turning point is ΔR, 0<|ΔR|≤10%.

2. The display device according to claim 1, wherein end points disposed opposite each other in the signal line segment with a largest resistance value among the N signal line segments are the first turning points.

3. The display device according to claim 1, wherein the Ma first turning points are continuously provided in each of the signal lines.

4. The display device according to claim 1, wherein the Ma first turning points are discontinuously provided in each of the signal lines.

5. The display device according to claim 1, wherein Mb=0 and Ma+Mb=N−1.

6. A display device having a display area and a peripheral area, the peripheral area being located at at least one side of the display area and including an internal driving circuit area and a wiring area, wherein the display device includes:
    a pixel array disposed in the display area;
    an internal driving circuit disposed in the internal driving circuit area and electrically connected with the pixel array; and
    a plurality of signal lines disposed in the wiring area, and electrically connected with the internal driving circuit and an external circuit,
    wherein each of the signal lines includes N signal line segments, Ma first turning points and Mb second turning points, the N signal line segments are connected with each other, each of the Ma first turning points and the Mb second turning points is located at a connecting site of two adjacent signal line segments, wherein N and Ma are positive integers, Mb is a positive integer or 0, N≥3, Ma≥2, Ma+Mb≤N−1, and a width change rate between two adjacent signal line segments connected with each first turning point is $\Delta W$, $0 < |\Delta W| \leq 10\%$.

7. The display device according to claim 6, wherein end points disposed opposite each other in the signal line segment with a smallest width among the N signal line segments are the first turning points.

8. The display device according to claim 6, wherein the Ma first turning points are continuously provided in each of the signal lines.

9. The display device according to claim 6, wherein the Ma first turning points are discontinuously provided in each of the signal lines.

10. The display device according to claim 6, wherein Mb=0 and Ma+Mb=N−1.

* * * * *